US012658874B2

(12) United States Patent
Wang et al.

(10) Patent No.: US 12,658,874 B2
(45) Date of Patent: Jun. 16, 2026

(54) PARALLEL-TYPE TX/RX CONCURRENT IMPEDANCE MATCHING UTILIZING RX MUTUAL INDUCTANCE MATCHING

(71) Applicant: QUALCOMM Incorporated, San Diego, CA (US)

(72) Inventors: Cheng-Han Wang, San Jose, CA (US); Takahide Nishio, San Jose, CA (US); Tu-I Tsai, Sunnyvale, CA (US); Mu Lu, San Mateo, CA (US); Chan Hong Park, San Jose, CA (US)

(73) Assignee: QUALCOMM Incorporated, San Diego, CA (US)

( * ) Notice: Subject to any disclaimer, the term of this patent is extended or adjusted under 35 U.S.C. 154(b) by 317 days.

(21) Appl. No.: 18/458,910

(22) Filed: Aug. 30, 2023

(65) Prior Publication Data

US 2025/0080077 A1 Mar. 6, 2025

(51) Int. Cl.
| | |
|---|---|
| *H03F 3/24* | (2006.01) |
| *H03H 7/38* | (2006.01) |
| *H04L 5/14* | (2006.01) |

(52) U.S. Cl.
CPC .............. *H03H 7/38* (2013.01); *H03F 3/245* (2013.01); *H03F 2200/294* (2013.01); *H03F 2200/451* (2013.01)

(58) Field of Classification Search
None
See application file for complete search history.

(56) References Cited

U.S. PATENT DOCUMENTS

| | | | | |
|---|---|---|---|---|
| 9,000,860 B2 * | 4/2015 | Mikhemar | ............. | H04B 15/00 |
| | | | | 455/78 |
| 9,548,715 B2 * | 1/2017 | Van Liempd | ............ | H03H 7/40 |
| 10,574,286 B2 * | 2/2020 | Wang | ....................... | H03F 3/193 |
| 10,581,478 B1 * | 3/2020 | Tam | ...................... | H04B 1/0458 |
| 11,533,075 B1 * | 12/2022 | Yu | ............................. | H03F 3/72 |
| 11,757,486 B2 * | 9/2023 | Hur | ...................... | H04B 1/0458 |
| | | | | 370/276 |
| 11,990,925 B2 * | 5/2024 | Weberg | .................. | H04B 1/581 |
| 2011/0281531 A1 | 11/2011 | Chiang et al. | | |
| 2015/0085709 A1 * | 3/2015 | Lee | .......................... | H04B 1/44 |
| | | | | 370/278 |
| 2017/0019135 A1 * | 1/2017 | Kwok | ..................... | H04B 1/581 |
| 2017/0077984 A1 * | 3/2017 | Esmaeilzadeh Najari | ................. | |
| | | | | H04B 1/006 |
| 2019/0074862 A1 | 3/2019 | Wang et al. | | |
| 2019/0165754 A1 * | 5/2019 | Zolomy | ............. | H03F 3/45475 |

(Continued)

OTHER PUBLICATIONS

International Search Report and Written Opinion—PCT/US2024/041099—ISA/EPO—Nov. 4, 2024.

*Primary Examiner* — Pablo N Tran
(74) *Attorney, Agent, or Firm* — Loza & Loza LLP

(57) ABSTRACT

An apparatus including: a transmitter output impedance matching circuit including an inductive element; a low noise amplifier (LNA) including a first field effect transistor (FET); a receiver input impedance matching circuit, including: a transformer including a first winding and a second winding; and a capacitor coupled in series with the first winding between a first end of the inductive element and a gate of the first FET, wherein the second winding is coupled to a second end of the inductive element; and a radio frequency (RF) port coupled between the first end of the inductive element and the capacitor.

22 Claims, 7 Drawing Sheets

(56)     References Cited

U.S. PATENT DOCUMENTS

2020/0381809 A1 *  12/2020  Parthasarathy ......... H04B 1/40
2021/0184825 A1      6/2021  Muharemovic et al.

* cited by examiner

PARALLEL-TYPE TX/RX CONCURRENT IMPEDANCE MATCHING UTILIZING RX MUTUAL INDUCTANCE MATCHING

FIELD

Aspects of the present disclosure relate generally to radio frequency (RF) front ends, and in particular, to a parallel-type transmitter/receiver (Tx/Rx) concurrent impedance matching utilizing Rx mutual inductance matching.

BACKGROUND

A transceiver may include a transmitter and a receiver that share a radio frequency (RF) port to an antenna. In a time division duplexing (TDD) communication scheme it may be desirable for the transmitter to transmit an RF signal via the RF port and antenna, while the receiver presents a high impedance to the transmitter to prevent damage to receiver components and leakage of the transmitter RF signal into the receiver. It may also be desirable for the receiver to receive an RF signal via the antenna and RF port, while the transmitter presents a high impedance to the receiver to prevent leakage of the received RF signal into the transmitter.

SUMMARY

The following presents a simplified summary of one or more implementations in order to provide a basic understanding of such implementations. This summary is not an extensive overview of all contemplated implementations, and is intended to neither identify key or critical elements of all implementations nor delineate the scope of any or all implementations. Its sole purpose is to present some concepts of one or more implementations in a simplified form as a prelude to the more detailed description that is presented later.

An aspect of the disclosure relates to an apparatus. The apparatus includes: a transmitter output impedance matching circuit including an inductive element; a low noise amplifier (LNA) including a first field effect transistor (FET); a receiver input impedance matching circuit, including: a transformer including a first winding and a second winding; and a capacitor coupled in series with the first winding between a first end of the inductive element and a gate of the first FET, wherein the second winding is coupled to a second end of the inductive element; and a radio frequency (RF) port coupled between the first end of the inductive element and the capacitor.

Another aspect of the disclosure relates to a method. The method includes receiving a radio frequency (RF) signal at a port; routing a first portion of the received RF signal from the port to a low noise amplifier (LNA) via a capacitor and a first winding of a transformer; and routing a second portion of the received RF signal from the port via an inductive element and a second winding of the transformer, wherein the second portion of the received RF signal increases a mutual inductance of the transformer.

Another aspect of the disclosure relates to a method. The method includes: while in a transmit mode: generating a transmit radio frequency (RF) signal at differential outputs of a power amplifier (PA); routing the transmit RF signal to an RF port via primary and secondary windings of a balun, wherein the balun improves an impedance match between the differential outputs of the PA and the RF port; and isolating a low noise amplifier (LNA) from the transmit RF signal via a capacitor coupled between the RF port and a ground terminal; and while in a receive mode: decoupling the capacitor from the ground terminal; routing a first portion of a received RF signal at the RF port to the LNA via the capacitor and a first winding of a transformer; and routing a second portion of the received RF signal from the RF port to the ground terminal via the secondary winding of the balun and a second winding of the transformer, wherein the second portion of the received RF signal increases a mutual inductance of the transformer to counter a negative reactance presented to the first portion of the received RF signal by the capacitor.

Another aspect of the disclosure relates to an apparatus. The apparatus includes: a transmit circuit including a transmitter output impedance matching circuit coupled between a power amplifier and a shared transmit-receive port; and a receive circuit including: a low noise amplifier (LNA); a receiver input matching circuit coupled between the shared transmit-receive port and an input of the LNA, the receiver input matching circuit, including: a transformer including a first winding and a second winding, wherein the second winding is coupled to the transmitter output impedance matching circuit.

To the accomplishment of the foregoing and related ends, the one or more implementations include the features hereinafter fully described and particularly pointed out in the claims. The following description and the annexed drawings set forth in detail certain illustrative aspects of the one or more implementations. These aspects are indicative, however, of but a few of the various ways in which the principles of various implementations may be employed and the description implementations are intended to include all such aspects and their equivalents.

DETAILED DESCRIPTION

The detailed description set forth below, in connection with the appended drawings, is intended as a description of various configurations and is not intended to represent the only configurations in which the concepts described herein may be practiced. The detailed description includes specific details for the purpose of providing a thorough understanding of the various concepts. However, it will be apparent to those skilled in the art that these concepts may be practiced without these specific details. In some instances, well-known structures and components are shown in block diagram form in order to avoid obscuring such concepts.

Figure 1:
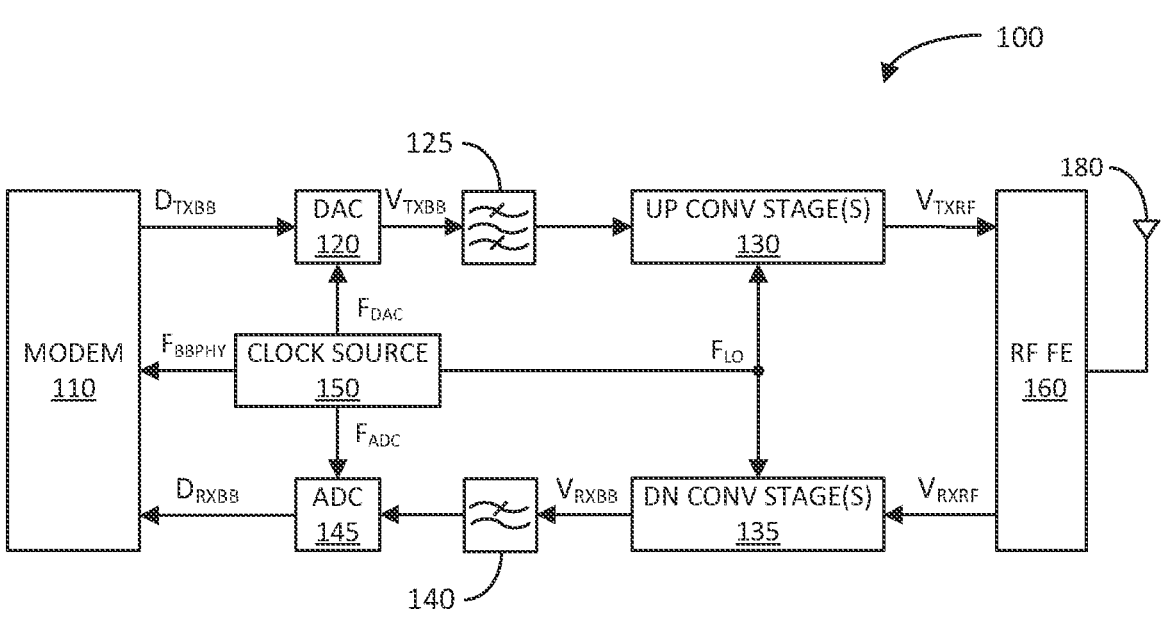
FIG. 1 illustrates a block diagram of an example transceiver in accordance with an aspect of the disclosure.

FIG. 1 illustrates a block diagram of an example transceiver 100 in accordance with an aspect of the disclosure. The transceiver 100 may be employed in many types of wireless communication devices (e.g., smart phones, tablet devices, desktop and laptop computers, automotive electronics, Internet of Things (IoT), and others), as well as in many types of wireless communication applications (e.g., wireless wide area networks (WWANs), such as those compliant with Long Term Evolution (LTE), $5^{th}$ Generation New Radio (5G, NR), both specified by the $3^{rd}$ Generation Partnership Project (3GPP), wireless local area networks (WLANs), such as WiFi specified by the Institute of Electrical and Electronics (IEEE) 802.11 protocols, ultra-wideband (UWB), V2X, personal area networks (PANs), such as Bluetooth, and others).

The transceiver 100 includes a modem 110, a digital-to-analog converter (DAC) 120, a spectrum emission mask (SEM) filter 125, one or more frequency upconverting stages 130 (e.g., a baseband to radio frequency (BB-to-RF) frequency upconverting stage, or a baseband-to-intermediate frequency-to-RF (BB-to-IF-to-RF) frequency upconverting stages), one or more frequency downconverting stages 135 (e.g., RF-to-BB, or RF-to-IF-to-BB), an anti-aliasing low pass filter (LPF) 140, and an analog-to-digital converter (ADC) 145. Additionally, the transceiver 100 includes at least one clock source 150 configured to generate a set of clock signals $F_{BBPHY}$, $F_{DAC}$, $F_{ADC}$, and $F_{LO}$ for the modem 110, the DAC 120, the ADC 145, and the frequency upconverting/downconverting stages 130 and 135, respectively. Further, the transceiver 100 includes an RF front end (RF FE) 160 and at least one antenna 180.

With regard to signal transmission, the modem 110 is configured to generate a digital transmit baseband data signal $D_{TXBB}$ based on (e.g., with a data rate dictated by) the clock signal $F_{BBPHY}$. The DAC 120 is configured to convert the digital transmit baseband data signal $D_{TXBB}$ into an analog transmit baseband digital signal $V_{TXBB}$ based on (e.g., at a sampling rate dictated by) the clock signal $F_{DAC}$. The one or more frequency upconverting stages 130 is configured to convert the analog transmit baseband signal $V_{TXBB}$ filtered by the SEM filter 125 into a transmit RF signal $V_{TXRF}$ based on one or more local oscillator (LO) clock signals $F_{LO}$, respectively. As discussed further herein, the RF FE 160 may include a power amplifier (PA) configured to amplify the transmit RF signal $V_{TXRF}$ for wireless transmission via the at least one antenna 180.

With regard to signal reception, the RF FE 160 may also include a low noise amplifier (LNA) configured to amplify an RF signal received via the at least one antenna 180 to generate a received RF signal $V_{RXRF}$, as discussed further herein. The one or more frequency downconverting stages 135 is configured to frequency downconvert the received RF signal $V_{RXRF}$ into an analog received baseband data signal $V_{RXBB}$ based on the one or more LO clock signals $F_{LO}$, respectively. Note that if the transceiver 100 employs time division duplexing (TDD) to transmit and receive signals, the frequency upconverting/downconverting stages 130 and 135 may use the same one or more LO clocks signals. The ADC 145 is configured to convert the analog received baseband data signal $V_{RXBB}$ filtered by the anti-aliasing filter 140 into a digital received baseband data signal $D_{RXBB}$ based on (e.g., at a sampling rate dictated by) the clock signal $F_{ADC}$. The modem 110 is configured to process (e.g., to extract data from) the digital received baseband data signal $D_{RXBB}$ based on (e.g., at a rate dictated by) the clock signal $F_{BBPHY}$.

Figure 2:
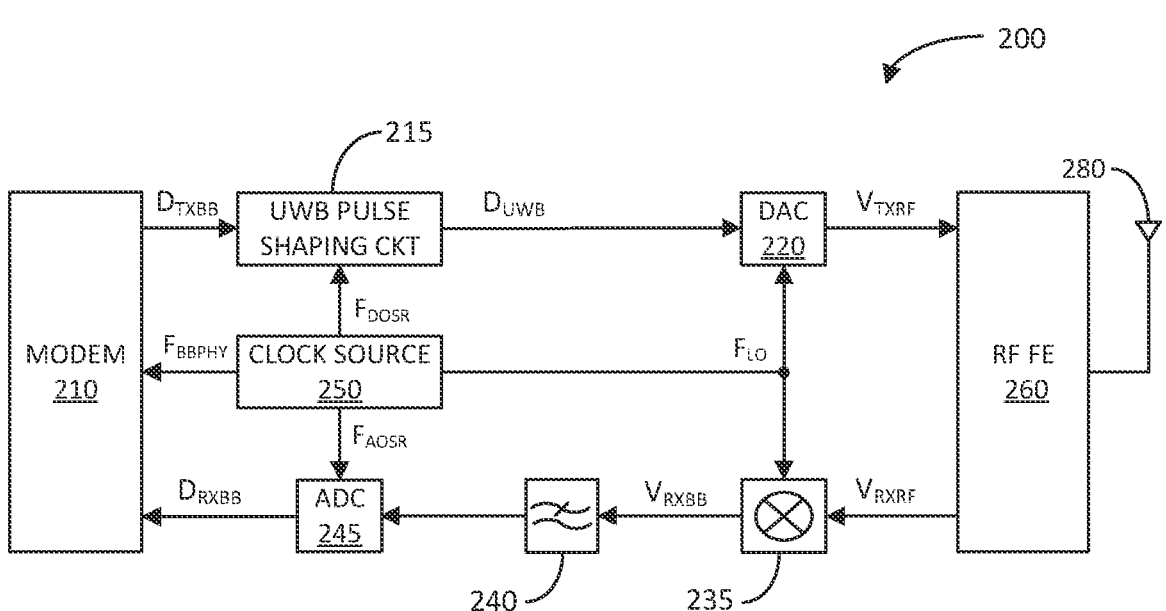
FIG. 2 illustrates a block diagram of another example transceiver in accordance with another aspect of the disclosure.

FIG. 2 illustrates a block diagram of another example transceiver 200 in accordance with another aspect of the disclosure. The transceiver 200 may be an example implementation of the transceiver 100 previously discussed. In particular, the transceiver 200 may be an example ultrawideband (UWB) transceiver configured to transmit and receive UWB signals (e.g., pulses).

With regard to UWB pulses, UWB connectivity is a short-range, wireless communication protocol that operates with a very high frequency as compared to other short-range wireless communication technologies (e.g., Bluetooth, wide local area network (WLAN), Zigbee, or the like), and uses a relatively wide frequency band (e.g., 500 MHz or greater) as compared to other short-range wireless communication technologies, which makes UWB usable for high-resolution positioning and localization purposes. In some cases, UWB technology may be used for location discovery, device ranging, or the like. In some cases, a UWB transmitter (e.g., the transceiver 100 or 200 implemented as a UWB transmitter) may transmit numerous pulses across the wide spectrum frequency, and a corresponding UWB receiver (e.g., located at another UWB-enabled device) may translate the pulses into data.

The transceiver 200 includes a modem 210, a UWB pulse shaping circuit 215, a DAC 220, a receive mixer 235, an anti-aliasing low pass filter (LPF) 240, and an ADC 245. Additionally, the transceiver 200 includes at least one clock source 250 configured to generate a set of clock signals $F_{BBPHY}$, $F_{DOSR}$ $F_{AOSR}$ and $F_{LO}$ for the modem 210, the UWB pulse shaping circuit 215, the ADC 245, and the DAC and receive mixer 220 and 235, respectively. Further, the transceiver 200 includes an RF FE 260 and at least one antenna 280.

With regard to signal transmission, the modem 210 is configured to generate a digital transmit baseband data signal $D_{TXBB}$ based on (e.g., with a data rate dictated by) the clock signal $F_{BBPHY}$. The UWB shaping circuit 215 is configured to convert the digital transmit baseband data signal $D_{TXBB}$ into a UWB pulse signal $D_{UWB}$ based on (e.g., at an oversampling rate (OSR) dictated by) the clock signal $F_{DOSR}$. The DAC 220 is configured to generate a transmit RF signal $V_{TXRF}$ based on the UWB pulse signal $D_{UWB}$ and the LO clock signal $F_{LO}$. As previously mentioned, the RF FE

260 may include a PA configured to amplify the transmit RF signal $V_{TXRF}$ for wireless transmission via the at least one antenna 280.

With regard to signal reception, the RF FE 260 may also include an LNA configured to amplify an RF signal received via the at least one antenna 280 to generate a received RF signal $V_{RXRF}$, as previously mentioned. The received mixer 235 is configured to frequency downconvert the received RF signal $V_{RXRF}$ into an analog received baseband data signal $V_{RXBB}$ based on the LO clock signal $F_{LO}$. The ADC 145 is configured to convert the analog received baseband data signal $V_{RXBB}$ filtered by the anti-aliasing filter 240 into a digital received baseband data signal $D_{RXBB}$ based on (e.g., at an oversampling rate (OSR) dictated by) the clock signal $F_{AOSR}$. The modem 210 is configured to process (e.g., to extract data from) the digital received baseband data signal $D_{RXBB}$ based on (e.g., at a rate dictated by) the clock signal $F_{BBPHY}$.

Figure 3:
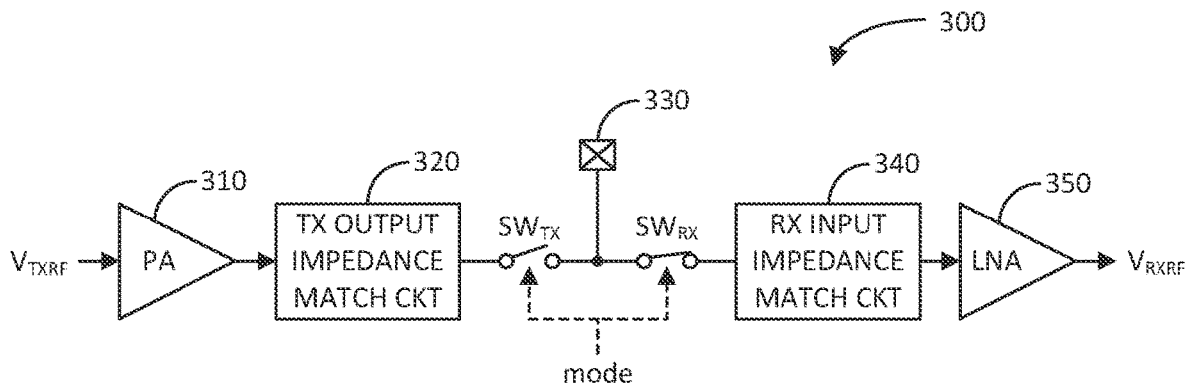
FIG. 3 illustrates a block diagram of an example radio frequency (RF) front end in accordance with another aspect of the disclosure.

FIG. 3 illustrates a block diagram of an example radio frequency (RF) front end 300 in accordance with another aspect of the disclosure. The RF front end 300 may be an example implementation of any of the RF FEs 160 and 260 previously discussed. The RF front end 300 may be implemented for a time division duplexing (TDD) signal transmission/reception, where signals are transmitted and received at different non-overlapping time intervals, respectively.

In particular, the RF front end 300 includes a power amplifier (PA) 310, a transmitter (Tx) output impedance matching circuit 320, a transmit switching device $SW_{TX}$, and an RF port 330 (e.g., a shared transmit-receive port for coupling to at least one antenna, such as the at least one antennas 180 and 280 previously discussed). The RF front end 300 further includes a receive switching device $SW_{RX}$, a receiver (Rx) input impedance matching circuit 340, and a low noise amplifier (LNA) 350.

In transmit mode, the PA 310 is configured to amplify the transmit RF signal $V_{TXRX}$ (e.g., received from the one or more frequency upconverting stages 130 of transceiver 100, or the DAC 220 of transceiver 200). The Tx output impedance matching circuit 320 is configured to substantially impedance match the output of the PA 310 to the at least one antenna coupled to the RF port 330. And, the transmit switching device $SW_{TX}$, responsive to a mode signal indicating transmit mode, is closed or on to route the amplified transmit RF signal $V_{TXRX}$ to the RF port 330. Additionally, the receive switching device $SW_{RX}$, also responsive to the mode signal indicating transmit mode, is open or off to substantially isolate the LNA 350 from the amplified transmit RF signal $V_{TXRX}$.

In receive mode, an RF signal received from the at least one antenna via the RF port 330 is provided to the input of the LNA 350 via the receive switching device $SW_{RX}$ and the Rx input impedance matching circuit 340. The receive switching device $SW_{RX}$, responsive to the mode signal indicating receive mode, is closed or on to route the received RF signal to the input of the LNA 350. The Rx input impedance matching circuit 340 is configured to substantially impedance match the at least one antenna coupled to the RF port 330 to the input of the LNA 350. The LNA 350 is configured to amplify the received RF signal to generate an amplified received RF signal $V_{RXRF}$ (e.g., provided to the one or more frequency downconverting stages 135 of transceiver 100, or the receive mixer 235 of transceiver 200). Additionally, the transmit switching device $SW_{TX}$, also responsive to the mode signal indicating receive mode, is open or off to substantially isolate the PA 310 from the received RF signal at the RF port 330.

A drawback of the RF front end 300 is that the transmit and receive switching devices $SW_{TX}$ and $SW_{RX}$ typically exhibit significant resistance that can reduce performance in the transmission and reception of signals. For example, in transmit mode, the resistance of the transmit switching device $SW_{TX}$ may reduce the power level of the transmit RF signal. In receive mode, the resistance of the receive switching device $SW_{RX}$ may increase the insertion loss of the receiver; and thereby, reduce receiver gain, increase noise figure (NF), and reduce signal-to-noise ratio (SNR). Alternatively, these switches $SW_{TX}$ and $SW_{RX}$ generally require several other supporting blocks to achieve higher performance for the RF front end 300. For example, such supporting blocks may include a charge pump to provide a high logic voltage level and a negative voltage to provide a low logic level, as well as specialized devices, which could reliably work with such high levels. However, this adds to the complexity, footprint, and cost of the RF front end 300.

Figure 4:
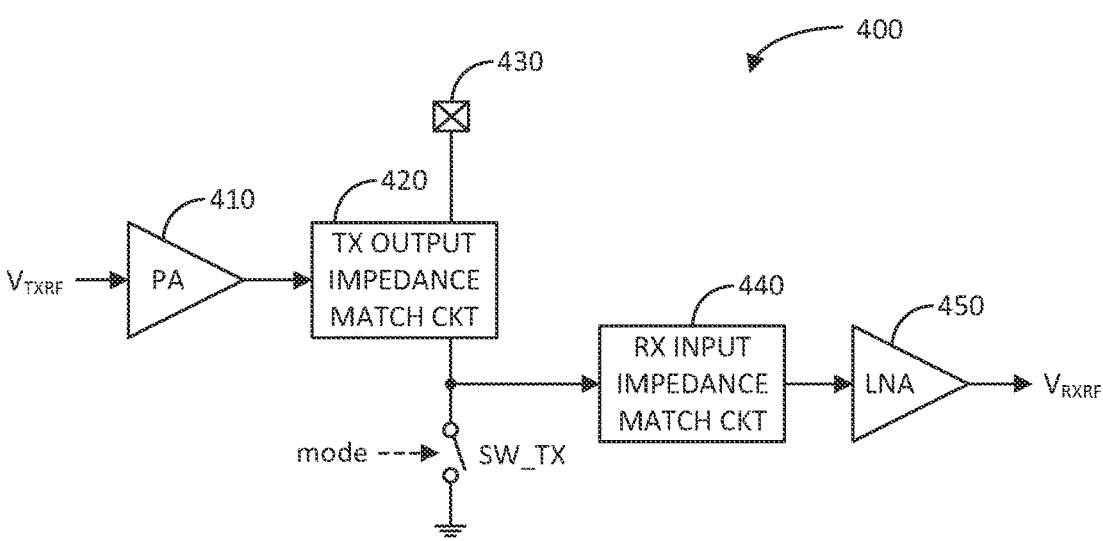
FIG. 4 illustrates a block diagram of another example radio frequency (RF) front end in accordance with another aspect of the disclosure.

FIG. 4 illustrates a block diagram of another example radio frequency (RF) front end 400 in accordance with another aspect of the disclosure. The RF front end 400 may also be an example implementation of any of the RF FEs 160 and 260 previously discussed. Similarly, the RF front end 400 may be implemented in a time-division duplexing (TDD) transceiver, where signals are transmitted and received at different non-overlapping time intervals, respectively. As discussed further herein, the RF front end 400 avoids signal-path transmit and receive switching devices, and employs concurrent impedance matching for the transmitter and receiver.

In particular, the RF front end 400 includes a power amplifier (PA) 410, a transmitter (Tx) output impedance matching circuit 420, and an RF port 430 (e.g., for coupling to at least one antenna, such as the at least one antennas 180 and 280 previously discussed). The RF front end 400 further includes a mode switching device SW_TX, a receiver (Rx) input impedance matching circuit 440, and a low noise amplifier (LNA) 450.

In transmit mode, the PA 410 is configured to amplify the transmit RF signal $V_{TXRX}$ (e.g., received from the one or more frequency upconverting stages 130 of transceiver 100, or the DAC 220 of transceiver 200). The Tx output impedance matching circuit 420 is configured to substantially impedance match the output of the PA 410 to the at least one antenna coupled to the RF port 430. The mode switching device SW_TX, responsive to a mode signal indicating transmit mode, is closed or on to couple the input of the receiver to ground terminal to substantially isolate the LNA 450 from the amplified transmit RF signal $V_{TXRX}$.

In receive mode, an RF signal received from the at least one antenna via the RF port 430 is provided to the input of the LNA 450 via the Tx output impedance matching circuit 420 and the Rx input impedance matching circuit 440. The mode switching device SW_TX, responsive to the mode signal indicating receive mode, is open or off to substantially isolate the input of the receiver from ground terminal. The Tx output impedance matching circuit 420 and the Rx input impedance matching circuit 440 are collectively configured to substantially impedance match the at least one antenna coupled to the RF port 430 to the input of the LNA 450. The LNA 450 is configured to amplify the received RF signal to generate an amplified received RF signal $V_{RXRF}$ (e.g., provided to the one or more frequency downconverting stages 135 of transceiver 100, or the receive mixer 235 of transceiver 200).

A drawback of the RF front end 400, as discussed further herein with reference to a specific implementation thereof, is that in receive mode, the Tx output impedance matching circuit 420 may exhibit a self-resonant frequency (SRF) that lies within or proximate certain frequency bands. Such SRF produces a relatively high impedance at the input of the receiver that the received RF signal from the at least one antenna via the RF port 430 may not be able to significantly reach the input of the LNA 450. Thus, the receiver may not be able to receive or even detect the RF signal.

Figure 5:
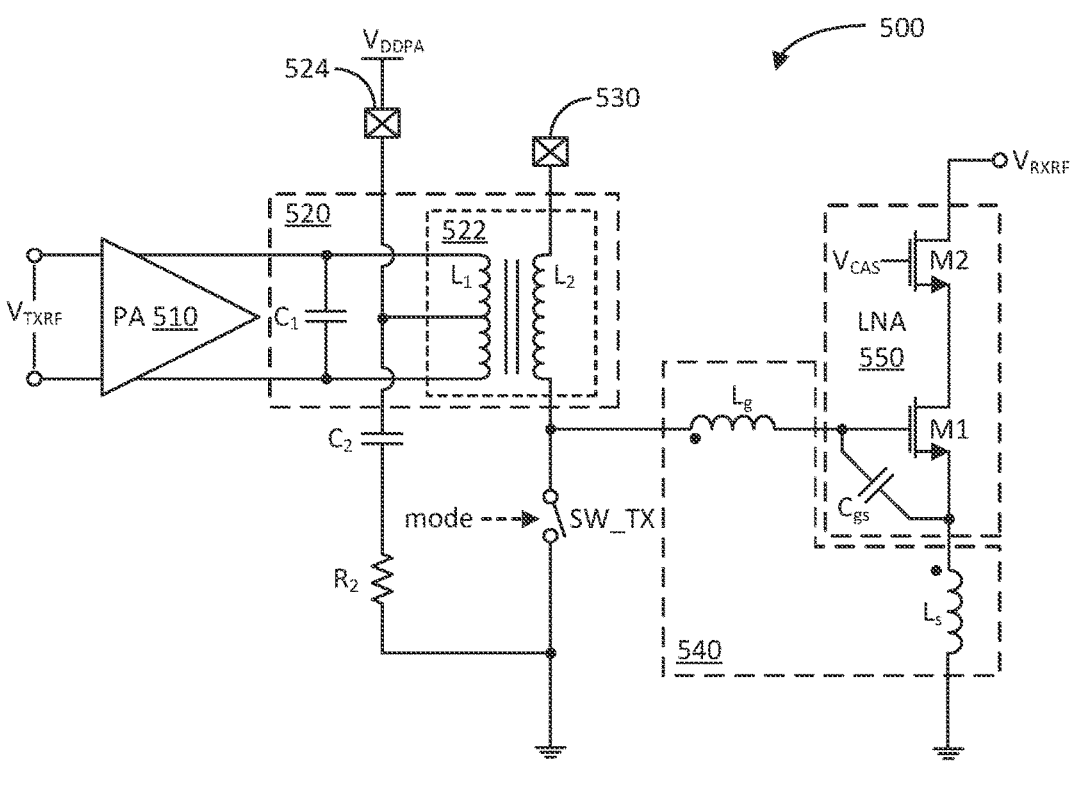
FIG. 5 illustrates a schematic diagram of another example radio frequency (RF) front end in accordance with another aspect of the disclosure.

FIG. 5 illustrates a schematic diagram of another example radio frequency (RF) front end 500 in accordance with another aspect of the disclosure. As mentioned, the RF front end 500 is an example implementation of the RF front end 400 previously discussed. Similarly, the RF front end 500 includes a power amplifier (PA) 510, a transmitter (Tx) output impedance matching circuit 520, and an RF port 530 (e.g., for coupling to at least one antenna, such as the at least one antennas 180 and 280 previously discussed). The RF front end 500 further includes a mode switching device SW_TX, a receiver (Rx) input impedance matching circuit 540, and a low noise amplifier (LNA) 550.

The PA 510 is configured to receive and amplify a differential transmit RF signal $V_{TXRX}$ (e.g., received from the one or more frequency upconverting stages 130 of transceiver 100, or the DAC 220 of transceiver 200). The Tx output impedance matching circuit 520 is configured to substantially impedance match differential outputs of the PA 510 to the at least one antenna coupled to the RF port 530. In this regard, the Tx output impedance matching circuit 520 includes a balun 522 including a primary winding $L_1$ and a secondary winding $L_2$. The differential outputs of the PA 510 are coupled to both ends of the primary winding $L_1$ of the balun 522, respectively. The Tx output impedance matching circuit 520 further includes a capacitor $C_1$ (e.g., parasitic and/or component) coupled across the differential outputs of the PA 510.

The RF front end 500 further includes a PA bias circuit including a port 524 for receiving a supply voltage $V_{DDPA}$, coupled to a series capacitor $C_2$ and series resistor $R_2$ to ground. The supply voltage $V_{DDPA}$ is routed to the PA 510 via a center tap of the primary winding $L_1$ of the balun 522 and the differential outputs of the PA 510. Additionally, the RF front end 500 includes a mode switching device SW_TX, responsive to a mode signal, coupled between the secondary winding $L_2$ of the balun 522 and ground terminal.

The Rx input impedance matching circuit 540 includes a first (e.g., gate) inductor $L_g$ and a second (e.g., source) inductor $L_s$. The LNA 550 includes a first field effect transistor (FET) M1 (e.g., an n-channel metal oxide semiconductor field effect transistor (NMOS FET), and a second FET M2 (e.g., an NMOS FET). The gate inductor $L_g$ is coupled between a node, between the secondary winding $L_2$ of the balun 522 and the mode switching device SW_TX, and the gate of the FET M1. As denoted by their polarity dots, the gate inductor $L_g$ and the source inductor $L_s$ may or may not be coupled to each other; and thereby, their coupling coefficient k may be between zero (0) and one (1).

The source inductor $L_s$ is coupled between the source of FET M1 and ground terminal. The second FET M2 is coupled in series with the first FET M1 between an output of the LNA 550 and ground terminal. The second FET M2 includes a gate configured to receive a cascode bias voltage $V_{CAS}$. It shall be understood that the LNA 550 may have different configurations. The LNA 550 is configured to amplify the received RF signal to generate an amplified received RF signal $V_{RXRF}$ (e.g., provided to the one or more frequency downconverting stages 135 of transceiver 100, or the receive mixer 235 of transceiver 200).

In transmit mode, the mode switching device SW_TX, responsive to a mode signal indicating transmit mode, is closed or on to couple the input of the Rx input impedance matching circuit 540 to ground terminal to substantially isolate the LNA 550 from the amplified transmit RF signal $V_{TXRX}$. In receive mode, the mode switching device SW_TX, responsive to the mode signal indicating receive mode, is open or off to substantially isolate the input of the Rx input impedance matching circuit 540 from ground terminal. The RF signal received from the at least one antenna via the RF port 530 is routed to the LNA 550 via the secondary winding $L_2$ of the balun 522 and the gate inductor $L_g$ of the Rx input impedance matching circuit 540. The Rx input impedance matching circuit 540 takes into account the output impedance matching network 520 of the PA 510 (e.g., the transformed impedances of $C_1$ and $L_1$ and the impedance of the secondary winding $L_2$ of the balun 522), the gate inductor $L_g$, and the source inductor $L_s$, as well as the gate-to-source capacitance $C_{gs}$ of the FET M1 to effectuate the impedance matching between the RF port 530 and the LNA 550.

As previously mentioned with regard to RF front end 400, the Tx output impedance matching circuit 520 may exhibit a self-resonant frequency (SRF) that lies within or proximate certain frequency bands. For example, the capacitance $C_1$ at the output of the PA 510 appears in the secondary winding $L_2$ of the balun 522 via the electromagnetic coupling. Further, because the balun 522 is not ideal, the secondary winding $L_2$ also exhibits resistance. Thus, the secondary winding $L_2$ may be modeled as a parallel RLC circuit (e.g., or a low Q inductor). As such, the secondary winding $L_2$ may exhibit an SRF within or proximate the frequency band of the received RF signal. Such SRF produces a relatively high impedance at the input of the receiver that the receive RF signal may not be able to significantly reach the input of the LNA 550.

Figure 6:
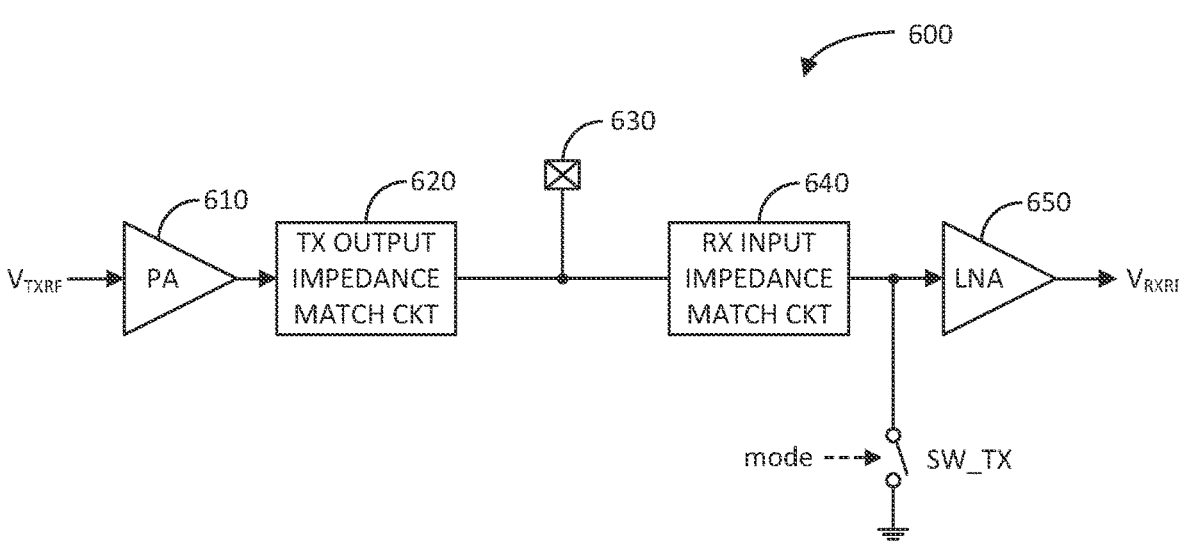
FIG. 6 illustrates a block diagram of another example radio frequency (RF) front end in accordance with another aspect of the disclosure.

FIG. 6 illustrates a block diagram of another example radio frequency (RF) front end 600 in accordance with another aspect of the disclosure. The RF front end 600 may also be an example implementation of any of the RF FEs 160 and 260 previously discussed. Similarly, the RF front end 600 may be implemented in a time-division duplexing (TDD) transceiver, where signals are transmitted and received at different non-overlapping time intervals, respectively. As discussed further herein, the RF front end 600 avoids the received RF signal traversing the Tx output impedance matching circuit; and thus, avoids the SRF that the Tx output impedance matching circuit may present to the received RF signal.

In particular, the RF front end 600 includes a power amplifier (PA) 610, a transmitter (Tx) output impedance matching circuit 620, and an RF port 630 (e.g., for coupling to at least one antenna, such as the at least one antennas 180 and 280 previously discussed). The RF front end 600 further includes a receiver (Rx) input impedance matching circuit 640, a mode switching device SW_TX, and a low noise amplifier (LNA) 650.

In transmit mode, the PA 610 is configured to amplify the transmit RF signal $V_{TXRX}$ (e.g., received from the one or more frequency upconverting stages 130 of transceiver 100, or the DAC 220 of transceiver 200). The Tx output impedance matching circuit 620 is configured to substantially impedance match the output of the PA 610 to the at least one antenna coupled to the RF port 630. The mode switching device SW_TX, responsive to a mode signal indicating transmit mode, is closed or on to couple the input of the receiver to ground terminal to substantially isolate the LNA 650 from the amplified transmit RF signal $V_{TXRX}$.

In receive mode, a received RF signal from the at least one antenna via the RF port 630 is provided to the input of the LNA 650 via the Rx input impedance matching circuit 640. The mode switching device SW_TX, responsive to the mode signal indicating receive mode, is open or off to substantially isolate the input of the receiver from ground terminal. The Rx input impedance matching circuit 640 is configured to substantially impedance match the at least one antenna coupled to the RF port 630 to the input of the LNA 650. The LNA 650 is configured to amplify the received RF signal to generate an amplified received RF signal $V_{RXRF}$ (e.g., provided to the one or more frequency downconverting stages 135 of transceiver 100, or the receive mixer 235 of transceiver 200).

In RF front end 600, the received RF signal does not traverse the Tx output impedance matching circuit 620. Thus, the received RF signal is not subjected to the high impedance of the SRF produced by the secondary winding of the balun of the Tx output impedance matching circuit 620. In fact, in RF front end 600, the SRF produced by the secondary winding of the balun improves the performance of the RF front end 600 because it presents a high impedance to the receiver; and thus, prevents the received RF signal from leaking into the transmitter.

Figure 7:
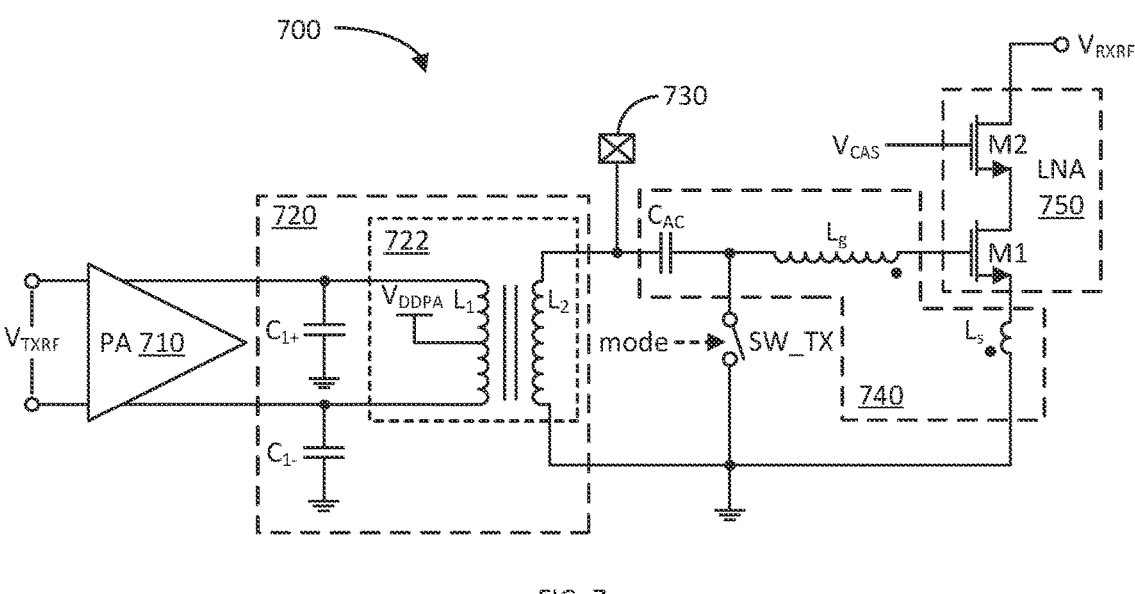
FIG. 7 illustrates a schematic diagram of another example radio frequency (RF) front end in accordance with another aspect of the disclosure.

FIG. 7 illustrates a schematic diagram of another example radio frequency (RF) front end 700 in accordance with another aspect of the disclosure. The RF front end 700 is an example implementation of the RF front end 600 previously discussed. Similarly, the RF front end 700 includes a power amplifier (PA) 710, a transmitter (Tx) output impedance matching circuit 720, and an RF port 730 (e.g., for coupling to at least one antenna, such as the at least one antennas 180 and 280 previously discussed). The RF front end 700 further includes a mode switching device SW_TX, a receiver (Rx) input impedance matching circuit 740, and a low noise amplifier (LNA) 750.

The PA 710 is configured to receive and amplify a differential transmit RF signal $V_{TXRX}$ (e.g., received from the one or more frequency upconverting stages 130 of transceiver 100, or the DAC 220 of transceiver 200). The Tx output impedance matching circuit 720 is configured to substantially impedance match differential outputs of the PA 710 to the at least one antenna coupled to the RF port 730. In this regard, the Tx output impedance matching circuit 720 includes a balun 722 including a primary winding $L_1$ and a secondary winding $L_2$. The differential outputs of the PA 710 are coupled to both ends of the primary winding $L_1$ of the balun 722, respectively. The Tx output impedance matching circuit 720 further includes a pair of capacitors $C_{1+}$ and $C_{1-}$ (e.g., parasitic and/or components) coupled between the differential outputs of the PA 710 and ground terminal, respectively. The supply voltage $V_{DDPA}$ for the PA 710 may be routed thereto via a center tap of the primary winding $L_1$ of the balun 722 and the differential outputs of the PA 710.

The Rx input impedance matching circuit 740 includes an alternating current (AC) coupled capacitor $C_{AC}$, a first (e.g., gate) inductor $L_g$ and a second (e.g., source) inductor $L_s$. The LNA 750 includes a first FET M1 (e.g., an NMOS FET), and a second FET M2 (e.g., an NMOS FET). The RF port 730 is coupled between the secondary winding $L_2$ of the balun 722 and the AC-coupled capacitor $C_{AC}$. The gate inductor $L_g$ is coupled between the AC-coupled capacitor $C_{AC}$ and the gate of the FET M1. The source inductor $L_s$ is coupled between the source of FET M1 and ground terminal. The gate and source inductors $L_g$ and $L_s$ may be mutually coupled to each other with opposite polarity, as indicated by the polarity dot on the gate side of inductor $L_g$ and the polarity dot on the ground side of inductor $L_s$.

The second FET M2 is coupled in series with the first FET M1 between an output of the LNA 750 and ground terminal. The second FET M2 includes a gate configured to receive a cascode bias voltage $V_{CAS}$. It shall be understood that the LNA 750 may have different configurations. The LNA 750 is configured to amplify the received RF signal to generate an amplified received RF signal $V_{RXRF}$ (e.g., provided to the one or more frequency downconverting stages 135 of transceiver 100, or the receive mixer 235 of transceiver 200). The mode switch SW_TX, responsive to a mode signal indicating transmit or receive mode, is coupled to a node, between the AC-coupled capacitor $C_{AC}$ and the gate inductor $L_g$, and ground terminal.

In transmit mode, the mode switching device SW_TX, responsive to a mode signal indicating transmit mode, is closed or on to couple the node between the AC-coupled capacitor $C_{AC}$ and the gate inductor $L_g$ to ground terminal so as to substantially isolate the LNA 750 from the amplified transmit RF signal $V_{TXRX}$. In receive mode, the mode switching device SW_TX, responsive to the mode signal indicating receive mode, is open or off to substantially isolate the input of the LNA 750 from ground terminal. Accordingly, the RF signal received from the at least one antenna via the RF port 730 is routed to the LNA 750 via the AC-coupled capacitor $C_{AC}$ and the gate inductor $L_g$ of the Rx input impedance matching circuit 740. The Rx input impedance matching circuit 740 takes into account the inductances and mutual inductance of the gate inductor $L_g$ and the source inductor $L_s$, as well as the capacitance of the AC-coupled capacitor $C_{AC}$ and the gate-to-source capacitance $C_{gs}$ of the FET M1 to effectuate the impedance matching between the RF port 730 and the LNA 750.

In receive mode, the self-resonant frequency (SRF) of the secondary winding $L_2$ of the balun 722, which presents a relatively high impedance as previously discussed, substantially isolates the receiver-side from the transmitter-side. So, in the case of RF front end 700, the SRF of the balun 722 is a positive attribute in contrast to the SRF of the balun 522 in RF front end 500.

However, in transmit mode, the AC-coupled capacitor $C_{AC}$ presents an issue to the transmitter. For example, from the transmitter's perspective, it is desirable for the AC-coupled capacitor $C_{AC}$ to be relatively small so that it presents a high impedance to the transmitter to substantially prevent leakage of the transmit RF signal to ground via the AC-coupled capacitor $C_{AC}$ and the mode switching device SW_TX. On the other hand, in receive mode, it is desirable for the AC-coupled capacitor $C_{AC}$ to be relatively large so as to exhibit a relatively low impedance to allow the received RF signal to propagate to the input of the LNA 750 with minimal loss.

One solution to the competing interest or dilemma presented by the AC-coupled capacitor $C_{AC}$ is to configure the AC-coupled capacitor $C_{AC}$ to have a moderate impedance or reactance (e.g., $-j50\Omega$) to try to lessen the leakage of the transmit RF signal to ground in transmit mode. Further, the inductance of the gate inductor $L_g$ is increased by a similar reactance (e.g., $+j50\Omega$) to counter or substantially cancel out the reactance of the AC-coupled capacitor $C_{AC}$. However, the increase in the reactance of the gate inductor $L_g$ also comes with an increase in the resistance of the gate inductor $L_g$. This results in additional loss in the received RF signal, which presents issues to the receiver, such as lower sensitivity, increased noise figure (NF), reduced signal-to-noise ratio (SNR), etc.

Figure 8:
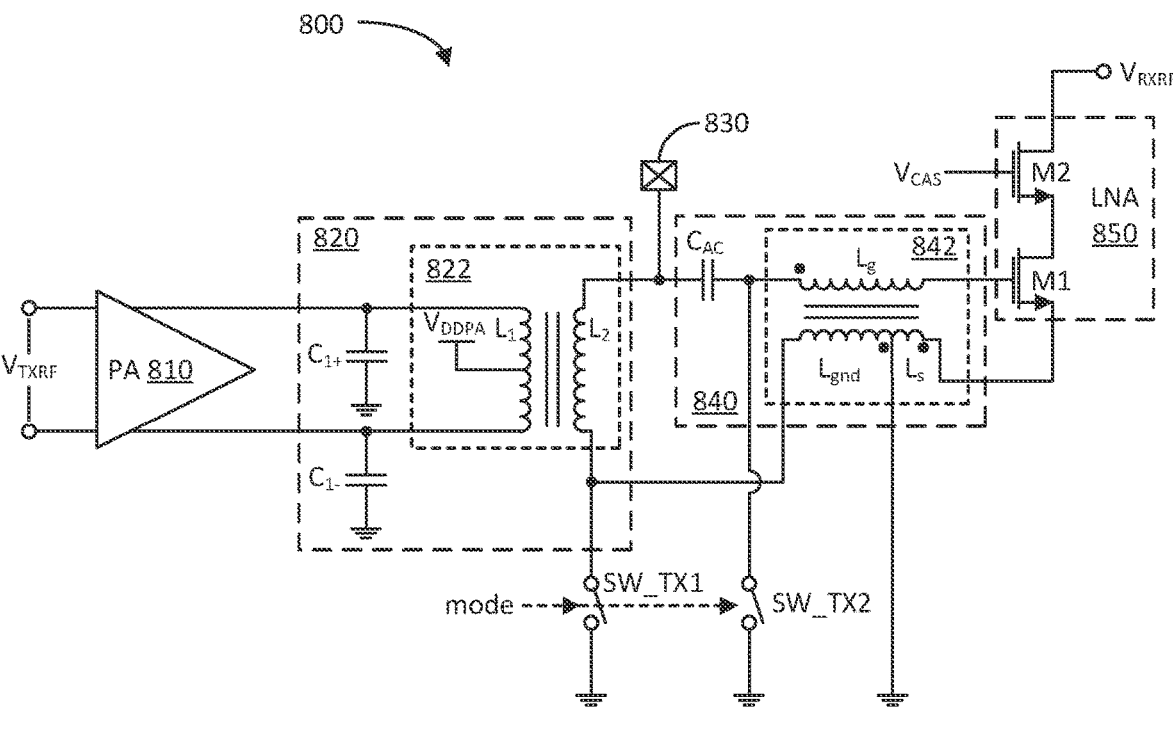
FIG. 8 illustrates a schematic diagram of another example radio frequency (RF) front end in accordance with another aspect of the disclosure.

FIG. 8 illustrates a schematic diagram of another example radio frequency (RF) front end in accordance with another aspect of the disclosure. The RF front end 800 is another example implementation of the RF front end 600 previously discussed.

In particular, the RF front end 800 includes a power amplifier (PA) 810, a transmitter (Tx) output impedance matching circuit 820, and an RF port 830 (e.g., for coupling to at least one antenna, such as the at least one antennas 180 and 280 previously discussed). The RF front end 800 further includes first and second mode switching devices SW_TX1 and SW_TX2, a receiver (Rx) input impedance matching circuit 840, and a low noise amplifier (LNA) 850.

The PA 810 is configured to receive and amplify a differential transmit RF signal $V_{TXRX}$ (e.g., received from the one or more frequency upconverting stages 130 of transceiver 100, or the DAC 220 of transceiver 200). The Tx output impedance matching circuit 820 is configured to substantially impedance match differential outputs of the PA 810 to the at least one antenna coupled to the RF port 830. In this regard, the Tx output impedance matching circuit 820 includes a balun 822 including a primary winding $L_1$ and a secondary winding $L_2$. The differential outputs of the PA 810 are coupled to both ends of the primary winding $L_1$ of the balun 822, respectively. The Tx output impedance matching circuit 720 further includes a pair of capacitors $C_{1+}$ and $C_{1-}$ (e.g., parasitic and/or components) coupled between the differential outputs of the PA 810 and ground terminal, respectively. The supply voltage $V_{DDPA}$ for the PA 810 may be routed thereto via a center tap of the primary winding $L_1$ of the balun 822 and the differential outputs of the PA 810.

The Rx input impedance matching circuit 840 includes an alternating current (AC) coupled capacitor $C_{AC}$ and a transformer 842. The LNA 850 includes a first FET M1 (e.g., an NMOS FET), and a second FET M2 (e.g., an NMOS FET). The RF port 830 is coupled between the secondary winding $L_2$ of the balun 822 and the AC-coupled capacitor $C_{AC}$. The transformer 842 includes a first winding $L_g$ coupled between the AC-coupled capacitor $C_{AC}$ and the gate of the FET M1. The transformer 842 includes a second winding partitioned into two sub-windings $L_{gnd}$ and $L_s$. The first and second windings $L_g$ and $L_{gnd}/L_s$ are wounded in an opposite polarity configuration, as indicated by the polarity dot on the $C_{AC}$ side of the first winding $L_g$ and the polarity dots on the FET M1 side of the second winding $L_{gnd}/L_s$. The two sub-windings $L_{gnd}$ and $L_s$ are separated by a tap coupled to ground terminal.

The second FET M2 is coupled in series with the first FET M1 between an output of the LNA 850 and the second winding $L_{gnd}/L_s$ of the transformer 842. The second FET M2 includes a gate configured to receive a cascode bias voltage $V_{CAS}$. It shall be understood that the LNA 850 may have different configurations. The LNA 850 is configured to amplify the received RF signal to generate an amplified received RF signal $V_{RXRF}$ (e.g., provided to the one or more frequency downconverting stages 135 of transceiver 100, or the receive mixer 235 of transceiver 200).

The first mode switching device SW_TX1, responsive to a mode signal indicating transmit or receive mode, is coupled between the secondary winding $L_2$ of the balun 822 and ground terminal. The secondary winding $L_{gnd}/L_s$ of the transformer 842 is coupled between the secondary winding $L_2$ of the balun 822 and the source of FET M1, with a tap coupled to ground terminal separating the sub-windings $L_{gnd}$ and $L_s$ as discussed. The second mode switching device SW_TX2, also responsive to the mode signal indicating transmit or receive mode, is coupled between the AC-coupled capacitor $C_{AC}$ and ground terminal.

In transmit mode, the first and second mode switching devices SW_TX1 and SW_TX2, responsive to a mode signal indicating transmit mode, are closed or on to couple the lower end of the secondary winding $L_2$ of the balun 822, and the node between the AC-coupled capacitor $C_{AC}$ and the first winding $L_g$ of the transformer 842 to ground terminal so as to substantially isolate the LNA 850 from the amplified transmit RF signal $V_{TXRX}$. The AC-coupled capacitor $C_{AC}$ may be sized for a capacitance to achieve a certain impedance or negative reactance (e.g., $-j50\Omega$) to provide the transmitter some isolation from the receiver. As discussed further herein, in receive mode, the transformer 842 counters or substantially cancels the negative reactance of the AC-coupled capacitor $C_{AC}$ with positive reactance (e.g., $+j50\Omega$) so as not to impact the received RF signal applied to the input of the LNA 850.

In receive mode, the first and second mode switching devices SW_TX1 and SW_TX2, responsive to the mode signal indicating receive mode, are open or off. The second mode switching device SW_TX2 being open allows a first portion of an RF signal received by the at least one antenna coupled to the RF port 830 to be applied to the input of the LNA 850 via the first winding $L_g$ of the transformer 842. The first mode switching device SW_TX1 being open allows a second portion of the received RF signal to be routed to the sub-winding $L_{gnd}$ of the second winding $L_{gnd}/L_s$ to increase the effective inductance of the transformer 842 by additive mutual inductance.

That is, the first portion of the received RF signal current flowing from the RF port 830 to the first winding $L_g$ of the transformer 842 has a certain phase or sign due to the capacitance or negative reactance of the AC-coupled capacitor $C_{AC}$. The second portion of the received RF signal current flowing from the RF port 830 to the second winding $L_{gnd}/L_s$ has a substantially opposite phase or sign (as the first portion of the received RF signal current) due to the inductance or positive reactance of the secondary winding $L_2$ of the balun 822. Because the first winding $L_g$ and second winding $L_{gnd}/L_s$ are in an opposite polarity configuration, the second portion of the received RF signal current flowing through the sub-winding $L_{gnd}$ augments the inductance of the transformer 842 by mutual inductance. Thus, in contrast to the RF front end 700, the inductance of the transformer 842 to cancel the negative reactance of the AC-coupled capacitor $C_{AC}$ may be increased by mutual inductance instead of increasing the inductance of the gate inductor $L_g$, which, as discussed, has the adverse effect of increasing its resistance.

Figure 9A:
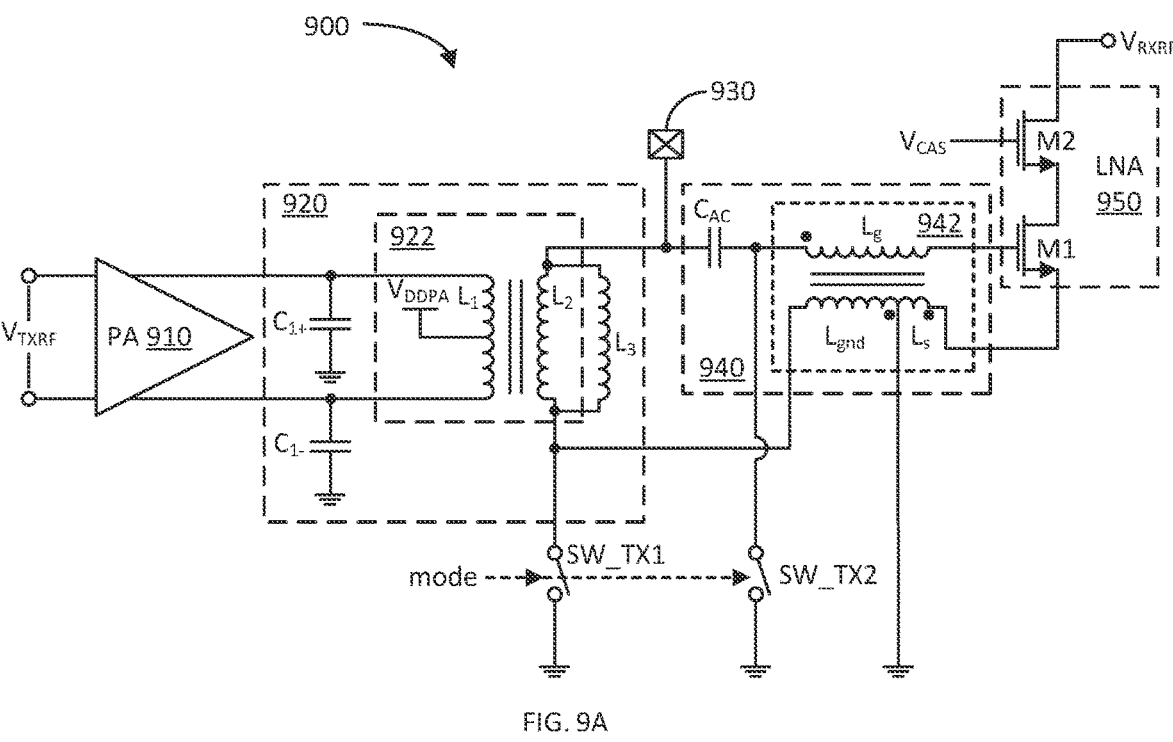
FIG. 9A illustrates a schematic diagram of another example radio frequency (RF) front end in accordance with another aspect of the disclosure.

FIG. 9A illustrates a schematic diagram of another example radio frequency (RF) front end 900 in accordance with another aspect of the disclosure. The RF front end 900 is a variation of RF front end 800 previously discussed, and includes many of the same/similar elements as indicated by the same reference numbers with the exception that the most significant digit is a "9" for RF front end 900 instead of an "8" for RF front end 800. Accordingly, the detailed discussion of such same/similar elements of RF front end 800 applies to the same/similar elements of RF front end 900.

The RF front end 900 differs from RF front end 800 in that it further includes an inductor $L_3$ coupled in parallel with the secondary winding $L_2$ of the balun 922. The inclusion of the inductor $L_3$ may be done, for example, if a higher capacitance for the AC-coupled capacitor $C_{AC}$ is desired. The higher capacitance of the AC-coupled capacitor $C_{AC}$ may adversely affect the output impedance or S22 of the transmitter (e.g., by moving the output impedance towards the negative reactance as visualized in a Smith chart). Accordingly, the added inductor $L_3$ may move the output impedance back towards the real axis (e.g., closer to 50Ω) of the Smith chart.

Figure 9B:
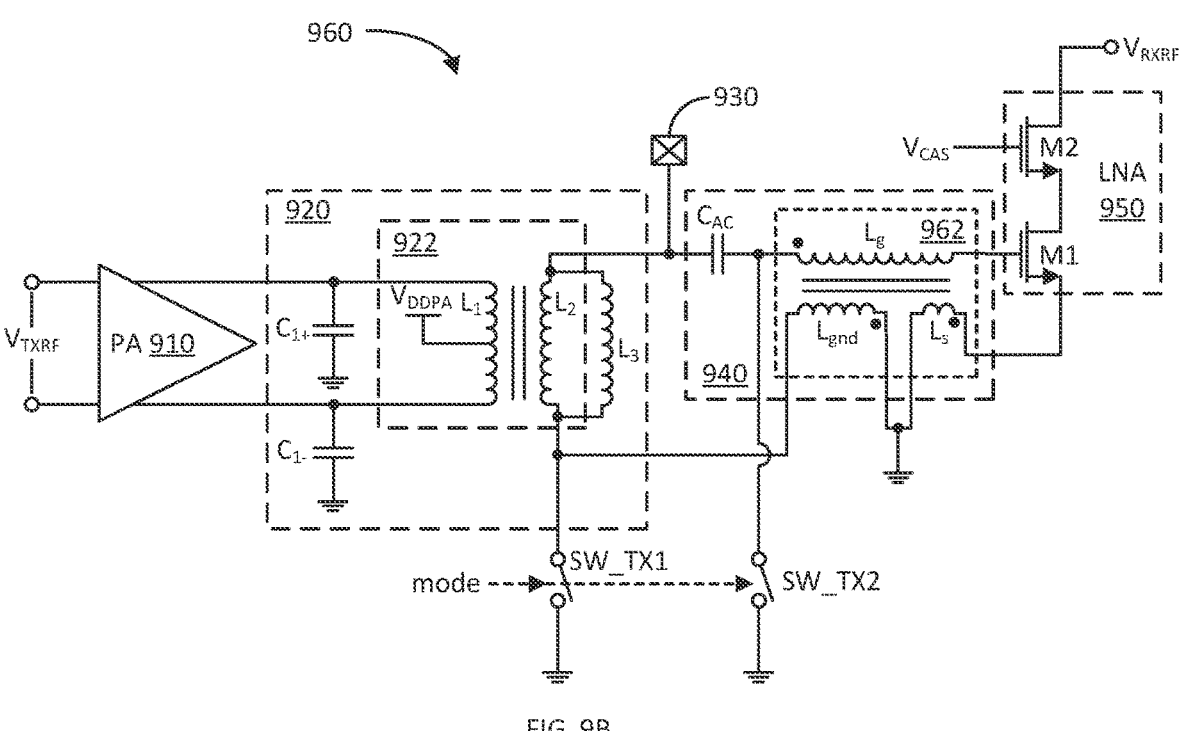
FIG. 9B illustrates a schematic diagram of another example radio frequency (RF) front end in accordance with another aspect of the disclosure.

FIG. 9B illustrates a schematic diagram of another example radio frequency (RF) front end 960 in accordance with another aspect of the disclosure. The RF front end 960 is a variation of RF front ends 800 and 900 previously discussed. The RF front end 960 differs from RF front ends 800 and 900 in that the RF front end 960 includes a 3-way transformer 962 instead of the 2-way transformer 842/942. That is, the 3-way transformer 962 has three (3) separate windings $L_g$, $L_{gnd}$, and $L_s$, whereas the 2-way transformer 842/942 has two windings $L_g$ and $L_{gnd}/L_s$, wherein the second winding is tapped to form the sub-windings $L_{gnd}$ and $L_s$, as previously discussed. Similarly, the second winding $L_{gnd}$ of the 3-way winding transformer 962 is coupled between the secondary winding $L_2$ of the balun 922 and ground, and the third winding $L_s$ is coupled between the source of first FET M1 and ground.

Figure 10:
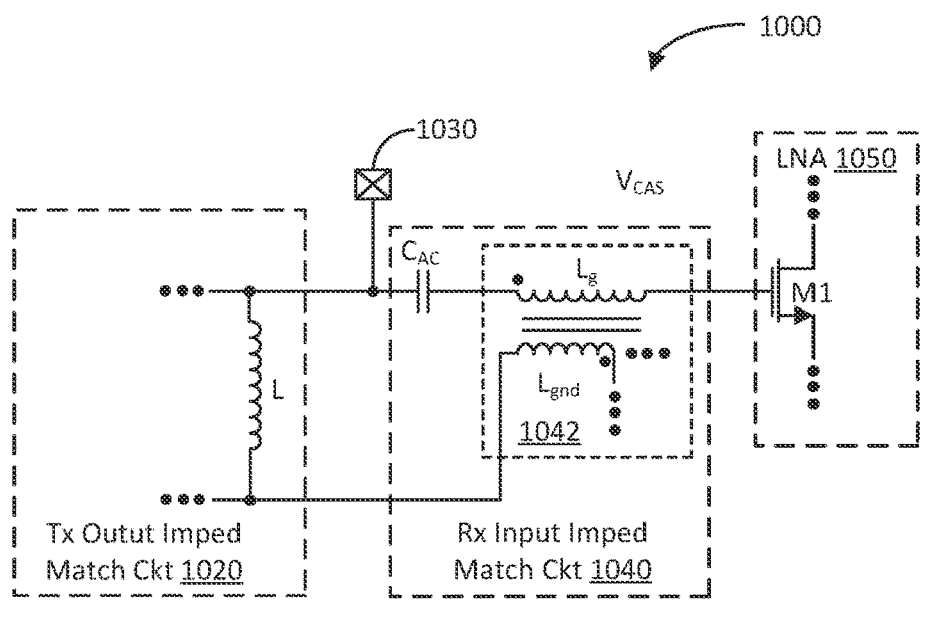
FIG. 10 illustrates a block/schematic diagram of another example radio frequency (RF) front end in accordance with another aspect of the disclosure.

FIG. 10 illustrates a block/schematic diagram of another example radio frequency (RF) front end 1000 in accordance with another aspect of the disclosure. The RF front end 1000 includes a transmitter output impedance matching circuit 1020 including an inductive element L, a low noise amplifier (LNA) 1050 including a first field effect transistor (FET) M1, and a receiver input impedance matching circuit 1040. The receiver input impedance matching circuit 1040, in turn, includes a transformer 1042 including a first winding $L_g$ and a second winding $L_{gnd}/L_s$, and a capacitor $C_{AC}$ coupled in series with the first winding $L_g$ between a first end of the inductive element L and a gate of the first FET M1, wherein the second winding $L_{gnd}/L_s$ is coupled to a second end of the inductive element L. Additionally, the RF front end 1000 includes a radio frequency (RF) port 1030 coupled between the first end of the inductive element L and the capacitor $C_{AC}$.

Figure 11:
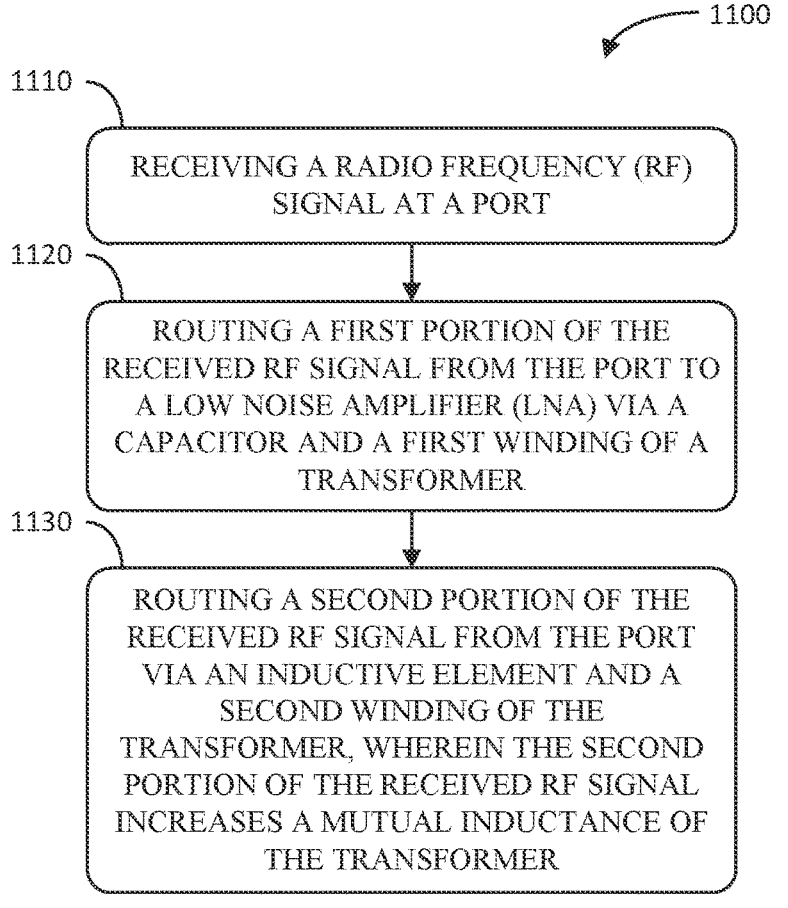
FIG. 11 illustrates a flow diagram of an example method of receiving a radio frequency (RF) signal in accordance with another aspect of the disclosure.

FIG. 11 illustrates a flow diagram of an example method 1100 of receiving a radio frequency (RF) signal in accordance with another aspect of the disclosure. The method 1100 includes receiving a radio frequency (RF) signal at a port (e.g., RF port 830, 930, or 1030) (block 1110). Additionally, the method 1100 includes routing a first portion of the received RF signal from the port to a low noise amplifier (LNA) (e.g., LNA 850, 950, or 1050) via a capacitor (e.g., $C_{AC}$) and a first winding (e.g., $L_g$) of a transformer (e.g., 842, 942, or 1042) (block 1120). The method 1100 also includes routing a second portion of the received RF signal from the port via an inductive element (e.g., $L_2$ or L) and a second winding (e.g., $L_{gnd}$) of the transformer, wherein the second portion of the received RF signal increases a mutual inductance of the transformer (block 1130).

Figure 12:
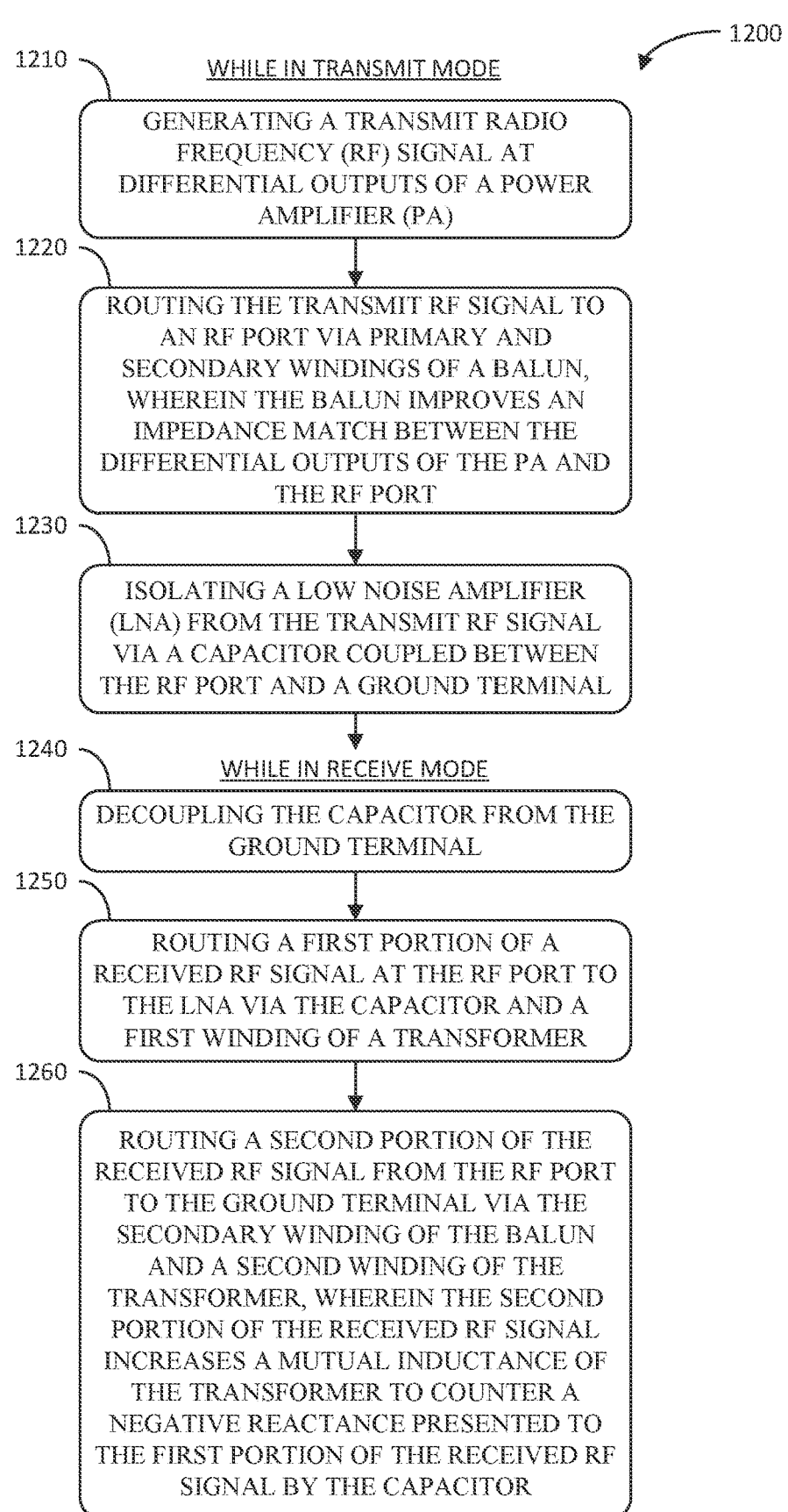
FIG. 12 illustrates a flow diagram of an example method of transmitting and receiving radio frequency (RF) signals in accordance with another aspect of the disclosure.

FIG. 12 illustrates a flow diagram of an example method 1200 of transmitting and receiving radio frequency (RF) signals in accordance with another aspect of the disclosure. The method 1200 includes, while in transmit mode: generating a transmit radio frequency (RF) signal at differential outputs of a power amplifier (PA) (e.g., PA 810 or 910) (block 1210). Additionally, the method 1200 includes routing the transmit RF signal to an RF port (e.g., 830, 930, or 1030) via primary and secondary windings (e.g., $L_1$ and $L_2$) of a balun (e.g., 822 or 922), wherein the balun improves an impedance match between the differential outputs of the PA and the RF port (block 1220). Further, the method 1200 includes isolating a low noise amplifier (LNA) (e.g., 850, 950, or 1050) from the transmit RF signal via a capacitor (e.g., $C_{AC}$) coupled (e.g., via closed switching device SW_TX2) between the RF port and a ground terminal (block 1230).

The method 1200 also includes, while in receive mode: decoupling the capacitor from the ground terminal (e.g., via open switching device SW_TX2) (block 1240). Additionally, the method 1200 includes routing a first portion of a received RF signal at the RF port to the LNA via the capacitor and a first winding (e.g., $L_g$) of a transformer (e.g., 842, 942, or 1042) (block 1250). Further, the method 1200 includes routing a second portion of the received RF signal from the RF port to the ground terminal via the secondary winding of the balun and a second winding (e.g., $L_{gnd}$) of the transformer, wherein the second portion of the received RF signal increases a mutual inductance of the transformer to counter a negative reactance presented to the first portion of the received RF signal by the capacitor (block 1260).

The following provides an overview of aspects of the present disclosure:

Aspect 1: An apparatus, comprising: a transmitter output impedance matching circuit including an inductive element; a low noise amplifier (LNA) comprising a first field effect transistor (FET); a receiver input impedance matching circuit, comprising: a transformer including a first winding and a second winding; and a capacitor coupled in series with the first winding between a first end of the inductive element and a gate of the first FET, wherein the second winding is coupled to a second end of the inductive element; and a radio frequency (RF) port coupled between the first end of the inductive element and the capacitor.

Aspect 2: The apparatus of aspect 1, wherein the first and second windings are in an opposite polarity configuration.

Aspect 3: The apparatus of aspect 1 or 2, wherein the second winding comprises a tap coupled to a ground potential.

Aspect 4: The apparatus of aspect 3, wherein the tap separates first and second sub-windings of the second winding.

Aspect 5: The apparatus of aspect 1 or 2, wherein the transformer further comprises a third winding coupled between a source of the first FET and a ground terminal, and wherein the second winding is coupled between the second end of the inductive element and the ground terminal.

Aspect 6: The apparatus of aspect 5, wherein the first and third windings are in opposite polarity configuration.

Aspect 7: The apparatus of any one of aspects 1-6, further comprising a switching device coupled between the second end of the inductive element and a ground terminal.

Aspect 8: The apparatus of aspect 7, wherein a closed or open state of the switching device is responsive to a mode signal indicating a transmit or receive mode, respectively Aspect 9: The apparatus of any one of aspects 1-8, further comprising a switching device coupled between a node, between the capacitor and the first winding, and a ground terminal.

Aspect 10: The apparatus of aspect 9, wherein a closed or open state of the switching device is responsive to a mode signal indicating a transmit or receive mode, respectively.

Aspect 11: The apparatus of any one of aspects 1-10, wherein the transmitter output impedance matching circuit comprises a balun including a primary winding and a secondary winding, wherein the inductive element comprises the secondary winding.

Aspect 12: The apparatus of aspect 11, wherein the inductive element further comprises an inductor coupled in parallel with the secondary winding.

Aspect 13: The apparatus of aspect 11 or 12, further comprising a power amplifier (PA) including differential outputs coupled to ends of the primary winding of the balun, respectively.

Aspect 14: The apparatus of any one of aspects 1-13, further comprising at least one antenna coupled to the RF port.

Aspect 15: The apparatus of any one of aspects 1-14, wherein the LNA further comprises a second FET coupled between an output of the LNA and the first FET, wherein the second FET includes a gate configured to receive a cascode bias voltage.

Aspect 16: The apparatus of any one of aspects 1-15, further comprising one or more frequency downconverting stages coupled to an output of the LNA.

Aspect 17: The apparatus of aspect 16, further comprising an analog-to-digital converter (ADC) coupled to an output of the one or more frequency downconverting stages, wherein the at least one clock source is coupled to the ADC.

Aspect 18: The apparatus of aspect 17, further comprising a modem coupled to an output of the ADC, wherein the at least one clock source is coupled to the modem.

Aspect 19: The apparatus of any one of aspects 1-18, further comprising a power amplifier (PA) including an output coupled to the transmitter output impedance matching circuit.

Aspect 20: The apparatus of aspect 19, further comprising: one or more frequency upconverting stages coupled to an input of the PA; and at least one clock source coupled to the one or more frequency upconverting stages.

Aspect 21: The apparatus of aspect 20, further comprising a digital-to-analog converter (DAC) coupled to an input of the one or more frequency upconverting stages.

Aspect 22: The apparatus of aspect 19, further comprising an ultra-wideband (UWB) pulse shaping circuit coupled to an input of a digital-to-analog converter (DAC), wherein the DAC includes an output coupled to the PA, and wherein at least one clock source is coupled to the UWB pulse shaping circuit and the DAC.

Aspect 23: A method, comprising: receiving a radio frequency (RF) signal at a port; routing a first portion of the received RF signal from the port to a low noise amplifier (LNA) via a capacitor and a first winding of a transformer; and routing a second portion of the received RF signal from the port via an inductive element and a second winding of the transformer, wherein the second portion of the received RF signal increases a mutual inductance of the transformer.

Aspect 24: The method of aspect 23, wherein the second portion of the received RF signal is routed to a ground terminal via the second winding.

Aspect 25: The method of aspect 24, further comprises coupling the LNA to the ground terminal via the second winding or a third winding of the transformer.

Aspect 26: The method of any one of aspects 23-25, further comprising: grounding a first node between the inductive element and the second winding of the transformer; grounding a second node between the capacitor and the first winding of the transformer; and generating a transmit RF signal across the inductive element and at the port.

Aspect 27: The method of aspect 26, further comprising: power amplifying a first RF signal to generate a second RF signal across a primary winding of a balun, wherein the inductive element comprises a secondary winding of the balun; and magnetically coupling the second RF signal to the secondary winding to generate the transmit RF signal.

Aspect 28: The method of aspect 27, wherein the second portion of the received RF signal is routed via the secondary winding of the balun and an inductor coupled in parallel with the secondary winding of the balun.

Aspect 29: A method, comprising: while in a transmit mode: generating a transmit radio frequency (RF) signal at differential outputs of a power amplifier (PA); routing the transmit RF signal to an RF port via primary and secondary windings of a balun, wherein the balun improves an impedance match between the differential outputs of the PA and the RF port; and isolating a low noise amplifier (LNA) from the transmit RF signal via a capacitor coupled between the RF port and ground; and while in a receive mode: removing the ground from the capacitor; routing a first portion of a received RF signal at the RF port to the LNA via the capacitor and a first winding of a transformer; and routing a second portion of the received RF signal from the RF port to ground via the secondary winding of the balun and a second winding of the transformer, wherein the second portion of the received RF signal increases a mutual inductance of the transformer to counter a negative reactance presented to the first portion of the received RF signal by the capacitor.

Aspect 30: The method of aspect 29, wherein routing the second portion of the received RF signal comprises routing some of the second portion of the received RF signal via an inductor coupled in parallel with the secondary winding of the balun.

Aspect 31: The method of aspect 30, further comprising coupling the LNA to the ground terminal via the second winding or a third winding of the transformer.

Aspect 32: An apparatus, comprising: means for receiving a radio frequency (RF) signal at a port; means for routing a first portion of the received RF signal from the port to a low noise amplifier (LNA) via a capacitor and a first winding of a transformer; and means for routing a second portion of the received RF signal from the port via an inductive element and a second winding of the transformer, wherein the second portion of the received RF signal increases a mutual inductance of the transformer.

Aspect 33: An apparatus, comprising: a transmit circuit including a transmitter output impedance matching circuit coupled between a power amplifier and a shared transmit-receive port; and a receive circuit including: a low noise amplifier (LNA); a receiver input matching circuit coupled between the shared transmit-receive port and an input of the LNA, the receiver input matching circuit, including: a transformer comprising a first winding and a second winding, wherein the second winding is coupled to the transmitter output impedance matching circuit.

The previous description of the disclosure is provided to enable any person skilled in the art to make or use the disclosure. Various modifications to the disclosure will be readily apparent to those skilled in the art, and the generic principles defined herein may be applied to other variations without departing from the spirit or scope of the disclosure. Thus, the disclosure is not intended to be limited to the examples described herein but is to be accorded the widest scope consistent with the principles and novel features disclosed herein.

What is claimed:
1. An apparatus, comprising:
  a transmitter output impedance matching circuit including
    an inductive element;

a low noise amplifier (LNA) comprising a first field effect transistor (FET);

a receiver input impedance matching circuit, comprising:

a transformer including a first winding and a second winding; and a capacitor coupled in series with the first winding between a first end of the inductive element and a gate of the first FET, wherein the second winding is coupled to a second end of the inductive element; and a radio frequency (RF) port coupled between the first end of the inductive element and the capacitor.

2. The apparatus of claim 1, wherein the first and second windings are in an opposite polarity configuration.

3. The apparatus of claim 2, wherein the transformer further comprises a third winding coupled between a source of the first FET and a ground terminal, and wherein the second winding is coupled between the second end of the inductive element and the ground terminal.

4. The apparatus of claim 3, wherein the first and third windings are in opposite polarity configuration.

5. The apparatus of claim 1, wherein the second winding comprises a tap coupled to a ground terminal.

6. The apparatus of claim 5, wherein the tap separates first and second sub-windings of the second winding.

7. The apparatus of claim 1, further comprising a switching device coupled between the second end of the inductive element and a ground terminal.

8. The apparatus of claim 7, wherein a closed or open state of the switching device is responsive to a mode signal indicating a transmit or receive mode, respectively.

9. The apparatus of claim 1, further comprising a switching device coupled between a node, between the capacitor and the first winding, and a ground terminal.

10. The apparatus of claim 9, wherein a closed or open state of the switching device is responsive to a mode signal indicating a transmit or receive mode, respectively.

11. The apparatus of claim 1, wherein the transmitter output impedance matching circuit comprises a balun including a primary winding and a secondary winding, wherein the inductive element comprises the secondary winding.

12. The apparatus of claim 11, wherein the inductive element further comprises an inductor coupled in parallel with the secondary winding.

13. The apparatus of claim 11, further comprising a power amplifier (PA) including differential outputs coupled to ends of the primary winding of the balun, respectively.

14. The apparatus of claim 1, further comprising at least one antenna coupled to the RF port.

15. The apparatus of claim 1, wherein the LNA further comprises a second FET coupled between an output of the LNA and the first FET, wherein the second FET includes a gate configured to receive a cascode bias voltage.

16. The apparatus of claim 1, further comprising:

one or more frequency downconverting stages coupled to an output of the LNA; and at least one clock source coupled to the one or more frequency downconverting stages.

17. The apparatus of claim 16, further comprising an analog-to-digital converter (ADC) coupled to an output of the one or more frequency downconverting stages, wherein the at least one clock source is coupled to the ADC.

18. The apparatus of claim 17, further comprising a modem coupled to an output of the ADC, wherein the at least one clock source is coupled to the modem.

19. The apparatus of claim 1, further comprising a power amplifier (PA) including an output coupled to the transmitter output impedance matching circuit.

20. The apparatus of claim 19, further comprising:

one or more frequency upconverting stages coupled to an input of the PA; and at least one clock source coupled to the one or more frequency upconverting stages.

21. The apparatus of claim 20, further comprising a digital-to-analog converter (DAC) coupled to an input of the one or more frequency upconverting stages.

22. The apparatus of claim 19, further comprising an ultra-wideband (UWB) pulse shaping circuit coupled to an input of a digital-to-analog converter (DAC), wherein the DAC includes an output coupled to the PA, and wherein at least one clock source is coupled to the UWB pulse shaping circuit and the DAC.

* * * * *